(12) United States Patent
Li et al.

(10) Patent No.: US 12,740,267 B2
(45) Date of Patent: Sep. 15, 2026

(54) OLED DISPLAY PANEL AND PREPARATION METHOD THEREOF

(71) Applicant: Shenzhen China Star Optoelectronics Semiconductor Display Technology Co., Ltd., Shenzhen (CN)

(72) Inventors: Caiwen Li, Shenzhen (CN); Shijian Qin, Shenzhen (CN); Xialiang Yuan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 438 days.

(21) Appl. No.: 18/496,889

(22) Filed: Oct. 29, 2023

(65) Prior Publication Data

US 2024/0224659 A1 Jul. 4, 2024

(30) Foreign Application Priority Data

Dec. 28, 2022 (CN) ......................... 202211701230.1

(51) Int. Cl.
*H10K 59/131* (2023.01)
*H10K 59/12* (2023.01)
*H10K 59/126* (2023.01)
*H10K 71/60* (2023.01)

(52) U.S. Cl.
CPC ....... *H10K 59/131* (2023.02); *H10K 59/1201* (2023.02); *H10K 59/126* (2023.02); *H10K 71/60* (2023.02)

(58) Field of Classification Search
CPC . H10K 59/131; H10K 59/1201; H10K 59/126
See application file for complete search history.

(56) References Cited

U.S. PATENT DOCUMENTS

2024/0237410 A9 * 7/2024 Qin ........................ H10K 59/00

FOREIGN PATENT DOCUMENTS

CN 112750846 B * 6/2023 ............. H10K 59/50
CN 115811904 B * 9/2025 ........... H10K 59/126

* cited by examiner

*Primary Examiner* — Marvin Payen
(74) *Attorney, Agent, or Firm* — PV IP PC; Wei Te Chung

(57) ABSTRACT

Provided are an OLED display panel and a preparation method thereof. The OLED display panel includes a light-shielding layer, a planarization layer, an anode layer, a light-emitting material layer, and a cathode layer. The light-shielding layer includes a light-shielding structure and a first structure. The anode layer includes an anode and a third structure. The first structure and the third structure disposed in a non-light-emitting region of the OLED display panel are electrically connected. The light-emitting material layer is on a side of the anode layer away from a substrate. The cathode layer is on a side of the light-emitting material layer away from the substrate. In the non-light-emitting region, the first structure is connected to a fixed value voltage. The light-emitting material layer is provided with a first via hole. The cathode layer is electrically connected to the third structure through the first via hole.

15 Claims, 2 Drawing Sheets

OLED DISPLAY PANEL AND PREPARATION METHOD THEREOF

CROSS-REFERENCE TO RELATED APPLICATION

This application claims the priority to Chinese Application No. 202211701230.1, filed on Dec. 28, 2022, the contents of which are incorporated herein by reference in their entirety.

FIELD

The present disclosure relates to the technical field of display, and in particularly, to an OLED display panel and a preparation method thereof.

BACKGROUND

When a large-sized OLED device panel is manufactured, there is often a situation that a cathode voltage drop is large, which has a great influence on the voltage of Vss, thereby seriously affecting the display effect. The analysis shows that one of the reasons for the large cathode voltage drop is that since the cathode is provided on a whole face, a signal of the cathode layer of the TFT device needs to be conducted from the TFT device to an edge of the panel. The path length of the signal transmission is long, resulting in serious signal attenuation.

At the same time, a phenomenon of precipitations and migrations of silver ions occurs in the silver layer in an anode layer. However, the migration of silver ions is a special phenomenon of electrochemical corrosion, which is easy to cause defects.

Therefore, in existing OLED display panel, there is a technical problem that a long path length of the signal transmission of the cathode layer causes a serious signal loss.

SUMMARY

According to an embodiment of the present disclosure, an OLED display panel has a light-emitting region and a non-light-emitting region, and includes an array substrate; a planarization layer; an anode layer; a light-emitting material layer and a cathode layer. The array substrate includes a substrate; a light-shielding layer on the substrate; and a source-drain layer on a side of the light-shielding layer away from the substrate. The light-shielding layer includes a light-shielding structure and a first structure. The source-drain layer includes a source, a drain, and a second structure. The first structure and the second structure are disposed in the non-light-emitting region. The planarization layer is on a side of the source-drain layer away from the substrate. The anode layer is on a side of the planarization layer away from the substrate and includes an anode and a third structure. The third structure is disposed in the non-light-emitting region. The light-emitting material layer is on a side of the anode layer away from the substrate, and is provided with a first via hole therethrough. The cathode layer is on a side of the light-emitting material layer away from the substrate. The second structure is electrically connected to the first structure, the third structure is electrically connected to the second structure, and the cathode layer is electrically connected to the third structure through the first via hole.

According to an embodiment of the present disclosure, a method for preparing an OLED display panel includes providing a substrate; forming a light-shielding layer on the substrate; forming an interlayer insulating layer on the light-shielding layer; forming a source-drain layer on the interlayer insulating layer; preparing a planarization layer on a side of the source-drain layer away from the substrate; preparing the anode layer on a side of the planarization layer away from the substrate; preparing a light-emitting material layer on a side of the anode layer away from the substrate; forming, in a non-light-emitting region of the OLED display panel, a first via hole throughout the light-emitting material layer; and preparing a cathode layer on a side of the light-emitting material layer away from the substrate. The light shielding layer includes a light-shielding structure and a first structure. The source-drain layer includes a source, a drain, and a second structure. The second structure is electrically connected to the first structure. The anode layer includes an anode and a third structure. The third structure is electrically connected to the second structure. The cathode layer is electrically connected to the third structure through the first via hole.

DESCRIPTION OF THE DRAWINGS

In order to explain the technical solution in an embodiment of the present disclosure more clearly, in the following, the accompanying drawings required in the description of the embodiments will be introduced briefly. It is apparent that the accompanying drawings in the following description are merely some of the embodiments of the present disclosure. For a person skilled in the art, other drawings may be obtained based on these accompanying drawings, without involving any inventive effort.

DETAILED DESCRIPTION

Figure 1:
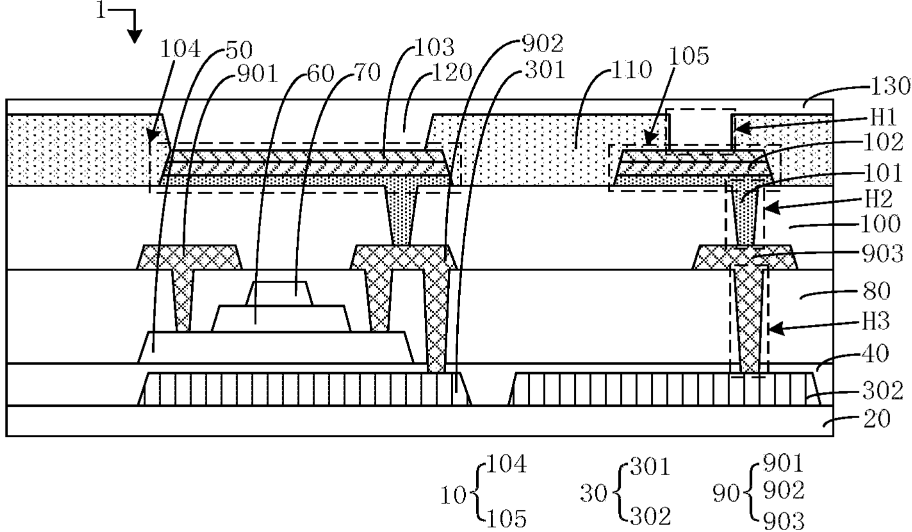
FIG. 1 is a first kind of cross-sectional diagram of an OLED display panel according to the present disclosure.

In the following, the technical solutions in an embodiment of the present disclosure will be clearly and completely described in conjunction with the accompanying drawings in the embodiments of the present disclosure. It is apparent that the described embodiments are merely part of the embodiments of the present disclosure, rather than all the embodiments. Based on the embodiments in the present disclosure, all other embodiments obtained by a person skilled in the art without involving any inventive effort are within the scope of the present disclosure. Furthermore, it should be understood that the particular embodiments described herein are for purposes of illustration and explanation only and are not used for limiting the application. In the present disclosure, if not stated to the contrary, the positional terms used such as "up" and "down" usually refer to up and down of the device in actual use or working state, particularly in the drawing direction in the attached drawings. While "in" and "out" are with respect to the contour of the device.

Referring to FIG. 1, an OLED display panel 1 according to the present disclosure includes a light-emitting region and a non-light-emitting region. The OLED display panel 1 includes an array substrate, a planarization layer 100, an anode layer 10, a light-emitting material layer, and a cathode layer 130. The array substrate includes a substrate 20, a light-shielding layer 30 provided above the substrate 20, and a source-drain layer 90 provided on a side of the light-shielding layer 30 away from the substrate 20. The light-shielding layer 30 includes a light-shielding structure 301 and a first structure 302 provided on a same layer. The source-drain layer 90 includes a source 901, a drain 902, and a second structure 903 provided on the a layer. The first structure 302 and the second structure 903 are disposed on the non-light-emitting region. The second structure 903 is electrically connected to the first structure 302. The planarization layer 100 is provided on a side of the source-drain layer 90 away from the substrate 20. The anode layer 10 is provided on a side of the planarization layer 100 away from the substrate 20. The anode layer 10 includes an anode 104 and a third structure 105 provided in the same layer. The third structure 105 is disposed in the non-light-emitting region. The third structure 105 is electrically connected to the second structure 903. The light-emitting material layer is provided on a side of the anode layer 10 away from the substrate 20. The cathode layer 130 is provided on a side of the light-emitting material layer away from the substrate 20. In the non-light-emitting region, the first structure 302 is connected to a fixed value voltage. The fixed value voltage is less than or equal to 20V. The light-emitting material layer is provided with a first via hole H1. The cathode layer 130 is electrically connected to the third structure 105 throughout the first via hole H1.

The third structure 105 may be a two-layer layered structure or a three-layer layered structure.

Further, the present disclosure will also start from the basic disciplines and structural design, cleverly use the migration of Ag to reduce the cathode voltage drop, and sufficiently convert the migration of silver ion, which is a harm in the industry originally, into an advantage.

In an embodiment, by forming the first via hole H1 on the third structure 105 of the non-light-emitting region, the cathode layer 130 is caused to be electrically connected to the first structure 302. Further by connecting the first structure 302 to the fixed value voltage, the cathode layer 130 and the first structure 302 are electrically connected and a potential difference is formed, causing the signal of the cathode layer 130 to be transmitted from the cathode layer 130 to the first structure 302, reducing the path length of the signal transmission of the cathode layer 130, thereby reducing the voltage drop of the cathode layer 130.

The technical solution of the present disclosure will now be described in connection with particular examples.

The fixed value voltage, layered structure, size, selected material, shape, and the like in the present disclosure are described only in terms of the best or better embodiments, and other inferior embodiments are intended to fall within the scope of the present disclosure, and details are not described herein. It should be noted that when the third structure 105 is a three-layer layered structure, the silver layer 102 may also be another metal layer, and details are not described herein.

In an embodiment, referring to FIG. 1, the third structure 105 is connected to the second structure 903 through a second via hole H2. The second structure 903 is connected to the first structure 302 through a third via hole H3.

The array substrate further includes a buffer layer 40 provided on a side of the light shielding layer 30 away from the substrate 20, an active layer 50 provided on a side of the buffer layer 40 away from the substrate 20, a gate insulating layer 60 provided on a side of the active layer 50 away from the substrate 20, a gate electrode layer 70 provided on a side of the gate insulating layer 60 away from the substrate 20, an interlayer insulating layer 80 provided on a side of the gate electrode layer 70 away from the substrate 20, a source-drain layer 90 provided on a side of the interlayer insulating layer 80 away from the substrate 20, a passivation layer provided on a side of the source-drain layer 90 away from the substrate 20, a planarization layer 100 provided on a side of the passivation layer 20 away from the substrate 20, and an anode layer 10 provided on a side of the planarization layer 100 away from the substrate 20.

The preparation material of the buffer layer 40 may be at least one of silicon nitride and silicon oxide.

The second via hole H2 is provided throughout the planarization layer 100 and the passivation layer.

The third via hole H3 is provided throughout the buffer layer 40 and the interlayer insulating layer 80.

It is understandable that the second structure 903 functions as a transitional connection. The connection via holes between the first structure 302 and the third structure 105 are divided into the second via hole H2 and the third via hole H3. The second via hole H2 and the third via hole H3 are formed respectively by a two-step process, thereby increasing the yield of the via holes.

In an embodiment, the third structure 105 is electrically connected to the second structure 903 through the second via hole H2. The second structure 903 is electrically connected to the first structure 302 through the third via hole H3. The second via hole H2 and the third via hole H3 are formed respectively, thereby improving the yield of the via holes.

Figure 2:
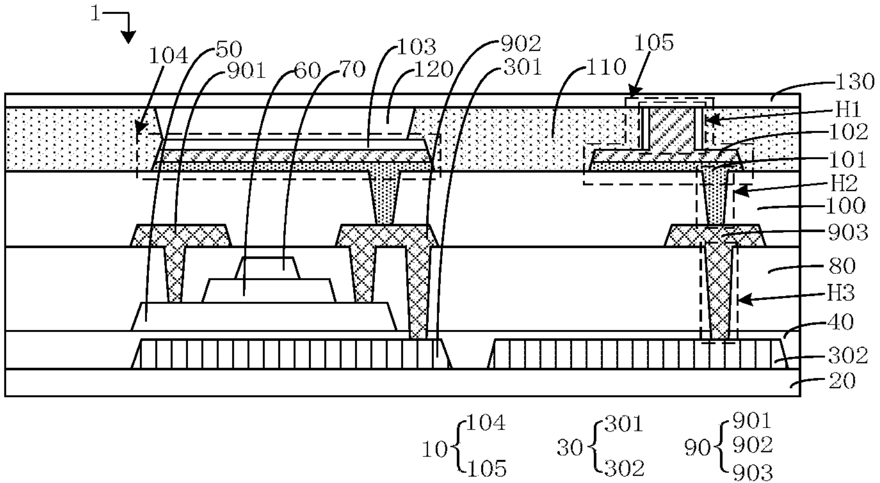
FIG. 2 is a second kind of cross-sectional diagram of an OLED display panel according to the present disclosure.

In an embodiment, referring to FIG. 2, the third structure 105 is a two-layer layered structure. The two-layer layered structure includes a first transparent conductive layer 101, and a silver layer 102 provided on a side of the first transparent conductive layer 101 away from the substrate 20. The silver layer 102 includes a body part, and an extending part connected to the body part and disposed within the via hole. The extending part is connected to the cathode layer 130.

The size of the extending part may be smaller than the size of the first via hole H1.

It is understandable that the extending part may be formed by the migration of silver ions in the silver layer 102. The first via hole H1 may be formed by the corrosion of silver ions in the silver layer 102, thereby saving one photomask.

It is understandable that the first transparent conductive layer 101 is provided on the side of the silver layer 102 which is near the substrate 20. By blocking, by the first transparent conductive layer 101, the migration of silver ions towards the substrate 20, the film layer on a side of the first transparent conductive layer 101 towards the substrate 20 is prevented from being corroded.

It should be noted that the third structure 105 may also be a single-layer structure. The single-layer structure is a silver layer 102. Using the characteristics that the diffusion of silver ions can corrode the pixel definition layer 110 and the light-emitting material layer 120, the first via hole H1 is formed, without requiring one additional photomask to form the first via hole H1.

In an embodiment, by providing the silver layer 102 on a side in the third structure 105 away from the substrate 20, the migration of silver ions in the silver layer 102 during energization is used for corroding the light-emitting material layer above, thereby forming the required first via hole H1. The cathode voltage drop is reduced, and one photomask can also be saved, thereby reducing the cost.

In an embodiment, the first structure 302 is grounded and the fixed value voltage is 0V.

It is understandable that one end of the first structure 302 is grounded and the other end of the first structure 302 is electrically connected to the cathode layer 130. At this time, the potential difference is maximum, so that the current is more easily directed to the path from the cathode layer 130 to the third structure 105 to the second structure 903 to the first structure 302. Compared to the cathode layer 130 provided on a whole face, the path through of the signal transmission of the cathode layer 130 is reduced apparently, and the voltage drop of the cathode layer 130 is reduced.

In an embodiment, by grounding the first structure 302, the potential difference between the cathode layer 130 and the first structure 302 is further increased, thereby the current signal of the cathode layer 130 is more easily directed towards the first structure 302.

In an embodiment, the cross-sectional shape of the first via hole H1 is an irregular shape.

It is understandable that when the first via hole H1 is formed by the corrosion of silver ions, the corresponding cross-sectional shape thereof is an irregular shape.

Further, the first via hole H1 may also be formed by hollowing out multiple sieve holes in the light-emitting material layer. That is, the light-emitting material layer at part of the positions within the first via hole H1 is hollowed out using silver ions, thereby forming multiple edge contacts between the silver layer 102 and the cathode layer 130.

In an embodiment, the light-emitting material layer 120 is in face contact with the cathode layer 130. The silver layer 102 goes throughout the light-emitting material layer and is in edge contact with the cathode layer 130.

It is understandable that the definition of an edge contact is: the position where the light-emitting material layer 120 is in face contact with the cathode layer 130 is non-conductive, and only the position where the silver layer 102 is in contact with the cathode layer 130 is conductive.

In an embodiment, the OLED display panel 1 includes multiple TFT devices. Any one of the TFT devices is provided with a corresponding third structure 105, a corresponding second structure 903, and a corresponding first structure 302. The third structure 105 is electrically connected to the cathode layer 130 through the first via hole H1, and the first structure 105, the second structure 903, and the third structure 302 are electrically connected to each other.

The third structure 105 may be provided near the TFT device. It is understandable that the third structure 105 may direct current signal of the cathode layer 130 of the TFT device corresponding thereto to the first structure, thereby further reducing the path length of the current transmission of the cathode layer 130.

It should be noted that the third structure 105 may also be connected in parallel with the cathode layer 130, thereby reducing the impedance of the cathode layer 103 and further reducing the voltage drop of the cathode layer 103.

In an embodiment, by providing a whole structure constituted by the first structure, the second structure, and the third structure in a one-to-one correspondence with the TFT device, the path length of the current transmission of the cathode layer 130 can be further reduced.

Figure 3:
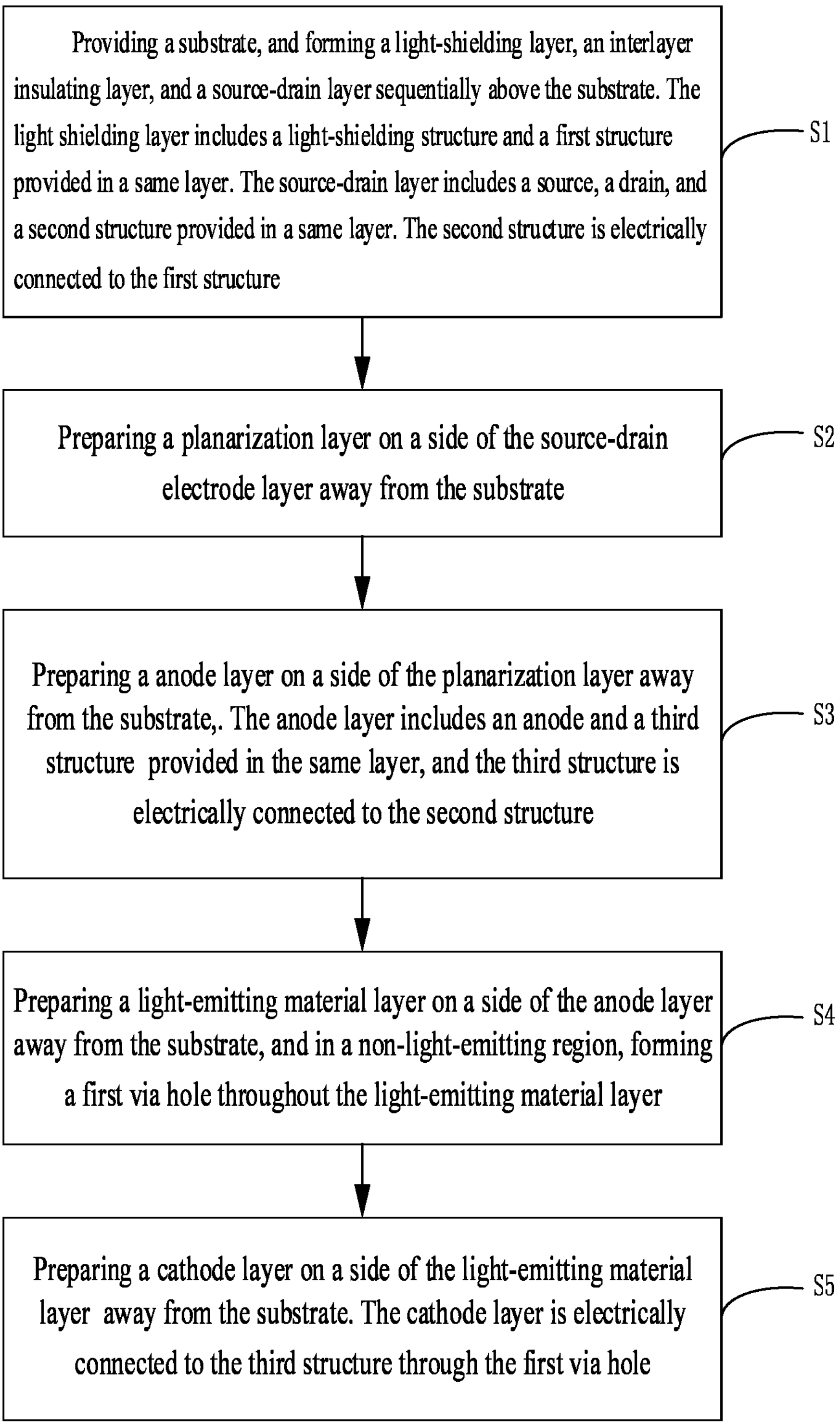
FIG. 3 is a flow diagram of a method for preparing an OLED display panel according to the present disclosure.

Referring to FIG. 3, according to an embodiment of the present disclosure, a method for preparing an OLED display panel 1 includes S1, S2, S3, S4 and S5.

S1: A substrate 20 is provided. a light-shielding layer 30 and a source-drain layer 90 is sequentially formed above the substrate 20. The light-shielding layer 30 includes a light-shielding structure 301 and a first structure 302 provided in the same layer. The source-drain layer 90 includes a source 901, a drain 902 and a second structure 903 which are arranged in the same layer. The second structure 903 is electrically connected to the first structure 302;

S2: A planarization layer 100 is prepared on a side of the source-drain layer 90 away from the substrate 20.

S3: A anode layer 10 is prepared on a side of the planarization layer 100 away from the substrate 20. The anode layer 10 includes an anode 104 and a third structure 105 provided in the same layer. The third structure 105 is electrically connected to the second structure 903;

S4: A light-emitting material layer is prepared on a side of the anode layer 10 away from the substrate 20. A first via hole H1 throughout the light-emitting material layer is formed in a non-light-emitting region of the OLED display panel.

S5: A cathode layer 130 is prepared on a side of the light-emitting material layer away from the substrate 20. The cathode layer 130 is electrically connected to the third structure 105 through the first via hole H1.

In an embodiment, preparing the anode layer 10 on the a side of the planarization layer 100 away from the substrate 20 further includes: preparing the anode 104 and the third structure 105 by a halftone mask. The anode 104 includes a three-layer layered structure. The third structure 105 includes a two-layer layered structure. The two-layer layered structure includes a first transparent conductive layer 101, and a silver layer 102 provided on a side of the first transparent conductive layer 101 away from the substrate 20.

In an embodiment, preparing the anode 104 and the third structure 105 by the halftone mask further includes: preparing the photoresist structure; depositing the first transparent conductive layer 101, the silver layer 102, and the second transparent conductive layer 103 by shielding of the photoresist structure; reducing a thickness of a part of the photoresist structure in the non-light-emitting region by a halftone mask; removing a part of the second transparent conductive layer 103 at the third structure 105 by the first etching solution, to form the two-layer layered structure of the third structure 105.

The first transparent conductive layer 101 is used for blocking the migration of silver ions in the silver layer 102 towards the substrate 20, thereby preventing the film layer on a side of the silver layer 102 facing towards the substrate 20 to corroded.

The first etching solution may be at least one of oxalic acid and phosphoric acid. The first etching solution needs to satisfy that only the first transparent conductive layer 101 can be removed without removing the silver layer 102.

The first transparent conductive layer 101 may be at least one of indium zinc oxide and indium tin oxide. The second transparent conductive layer 103 may be at least one of indium zinc oxide and indium tin oxide.

In an embodiment, the two-layer layered structure of the third structure 105 is formed and the silver layer 102 is on a side of the third structure 105 away from the substrate 20, thereby the first via hole H1 can be formed by using the migration and the corrosion of silver ions during energization, thereby saving one photomask.

For example, in an embodiment, forming the first via hole H1 throughout the light-emitting material layer includes: applying a voltage to the silver layer 102 to cause silver ions in the silver layer 102 to migrate towards the cathode layer 130; and penetrating, by the silver ions, the light-emitting material layer by a migration to form the first via hole H1.

In an embodiment, the first via hole H1 goes throughout the pixel definition layer 110, and the light-emitting material layer 120 provided on a side of the pixel definition layer 110 away from the substrate 20.

In an embodiment, when the interlayer insulating layer 80 is being prepared, another halftone mask may be used, and the etching is synchronously performed, to form the source via hole and the drain via hole which are throughout the interlayer insulating layer 80, and the third via hole H3 throughout the interlayer insulating layer 80 and the buffer layer 40.

The source via hole and the drain via hole are respectively used for connecting the source 901 and the drain 902 to connect to the active layer 50.

According to the present disclosure, it is further provided a display module and a display device. The display module and the display device both include the above-mentioned OLED display panel, which are not described herein.

The OLED display panel according to an embodiment includes an array substrate, a planarization layer, an anode layer, a light-emitting material layer, and a cathode layer. The array substrate includes a substrate, a light-shielding layer provided above the substrate, and a source-drain layer provided on a side of the light-shielding layer away from the substrate. The light-shielding layer includes a light-shielding structure and a first structure provided in the same layer. The source-drain layer includes a source, a drain, and a second structure provided in the same layer. The first structure and the second structure are disposed in the non-light-emitting region. The second structure is electrically connected to the first structure. The planarization layer is provided on a side of the source-drain layer away from the substrate. The anode layer is provided on a side of the planarization layer away from the substrate. The anode layer includes an anode electrode and a third structure provided in the same layer. The third structure is disposed in the non-light-emitting region. The third structure is electrically connected to the second structure. The light-emitting material layer is provided on a side of the anode layer away from the substrate. The cathode layer is provided on a side of the light-emitting material layer away from the substrate. In the non-light-emitting region, the first structure is connected to a fixed value voltage. The fixed value voltage is less than or equal to 20V. The light-emitting material layer is provided with a first via hole. The cathode layer is electrically connected to the third structure through the first via hole. By forming a first via hole on the third structure of the non-light-emitting region, the cathode layer is caused to be electrically connected to the first structure. Then by connecting the first structure to a fixed value voltage, the cathode layer and the first structure are electrically connected and a potential difference is formed, causing the signal of the cathode layer to be transmitted from the cathode layer to the first structure, reducing the path length of the signal transmission of the cathode layer, thereby reducing the voltage drop of the cathode layer.

In the above-mentioned embodiments, the description of each embodiment has its own emphasis, and parts not described in detail in a certain embodiment may be referred to the related description of other embodiments.

In the above, the OLED display panel and the preparation method of the OLED display panel according to an embodiment of the present disclosure are described in detail, and the principles and embodiments of the present disclosure are described herein using particular examples. The description of the above embodiments is merely used for helping to understand the method and the core idea of the present disclosure. At the same time, variations will occur to a person skilled in the art in both the particular embodiments and the range of applications in accordance with the teachings of the present disclosure. In view of the foregoing, the present description should not be construed as limiting the application.

What is claimed is:

1. An Organic Light Emitting Diode (OLED) display panel, having a light-emitting region and a non-light-emitting region, comprising:

an array substrate comprising:

a substrate;

a light-shielding layer on the substrate, wherein the light-shielding layer comprises a light-shielding structure and a first structure; and a source-drain layer on a side of the light-shielding layer away from the substrate, wherein the source-drain layer comprises a source, a drain, and a second structure, and the first structure and the second structure are disposed in the non-light-emitting region;

a planarization layer on a side of the source-drain layer away from the substrate;

an anode layer on a side of the planarization layer away from the substrate, wherein the anode layer comprises an anode and a third structure, and the third structure is disposed in the non-light-emitting region;

a light-emitting material layer on a side of the anode layer away from the substrate; and a cathode layer on a side of the light-emitting material layer away from the substrate, wherein the second structure is electrically connected to the first structure, the third structure is electrically connected to the second structure, the light-emitting material layer is provided with a first via hole therethrough, and the cathode layer is electrically connected to the third structure through the first via hole.

2. The OLED display panel according to claim 1, wherein the third structure is a two-layer layered structure comprising a first transparent conductive layer and a silver layer, wherein the silver layer is on a side of the first transparent conductive layer away from the substrate, and comprises:

a body part disposed on a surface of the first transparent conductive layer; and an extending part connected to the body part, disposed within the via hole, connected to the cathode layer.

3. The OLED display panel according to claim 1, further comprising a plurality of TFT devices, wherein the first structure, the second structure, and the third structure are provided in a one-to-one correspondence with one of the plurality of TFT devices.

4. The OLED display panel according to claim 3, wherein the light-emitting material layer contacts the cathode layer, and the silver layer contacts the cathode layer throughout the light-emitting material layer.

5. The OLED display panel of claim 1, wherein the third structure is connected in parallel with the cathode layer.

6. A preparation method of an Organic Light Emitting Diode (OLED) display panel, comprising:

providing a substrate;

forming a light-shielding layer on the substrate, wherein the light shielding layer comprises a light-shielding structure and a first structure;

forming an interlayer insulating layer on the light-shielding layer;

forming a source-drain layer on the interlayer insulating layer, wherein the source-drain layer comprises a source, a drain, and a second structure electrically connected to the first structure;

preparing a planarization layer on a side of the source-drain layer away from the substrate;

preparing an anode layer on a side of the planarization layer away from the substrate, wherein the anode layer comprises an anode and a third structure, and the third structure is electrically connected to the second structure;

preparing a light-emitting material layer on a side of the anode layer away from the substrate;

forming, in a non-light-emitting region of the OLED display panel, a first via hole throughout the light-emitting material layer; and preparing a cathode layer on a side of the light-emitting material layer away from the substrate, wherein the cathode layer is electrically connected to the third structure through the first via hole.

7. The preparation method of the OLED display panel according to claim 6, wherein the preparing the anode layer on a side of the planarization layer away from the substrate further comprises:

preparing the anode and the third structure by a halftone mask, wherein the anode comprises a three-layer layered structure, the third structure comprises a two-layer layered structure having a first transparent conductive layer and a silver layer, and the silver layer is on a side of the first transparent conductive layer away from the substrate.

8. The preparation method of the OLED display panel according to claim 7, wherein the preparing the anode and the third structure by the halftone mask further comprises:

preparing a photoresist structure;

depositing the first transparent conductive layer, the silver layer and a second transparent conductive layer by the photoresist structure;

reducing a thickness of part of the photoresist structure in the non-light-emitting region by a halftone mask;

removing part of the second transparent conductive layer at the third structure with a first etching solution, to form the two-layer layered structure of the third structure.

9. The preparation method of the OLED display panel according to claim 8, wherein the forming the first via hole throughout the light-emitting material layer comprises:

forming the first via hole by striking the light-emitting material layer with the silver ions from the silver layer driven by an applied voltage.

10. The preparation method of the OLED display panel according to claim 6, wherein the forming the interlayer insulating layer on the light-shielding layer comprises: forming, by a second halftone mask, a source via hole and a drain via hole by etching the interlayer insulating layer and the third via hole by etching the interlayer insulating layer and a buffer layer.

11. A display device, comprising an Organic Light Emitting Diode (OLED) display panel, wherein the OLED display panel has a light-emitting region and a non-light-emitting region, and comprises:

an array substrate comprising:

a substrate;

a light-shielding layer on the substrate, wherein the light-shielding layer comprises a light-shielding structure and a first structure; and a source-drain layer on a side of the light-shielding layer away from the substrate, wherein the source-drain layer comprises a source, a drain, and a second structure, and the first structure and the second structure are disposed in the non-light-emitting region;

a planarization layer on a side of the source-drain layer away from the substrate;

an anode layer on a side of the planarization layer away from the substrate, wherein the anode layer comprises an anode and a third structure, and the third structure is disposed in the non-light-emitting region;

a light-emitting material layer on a side of the anode layer away from the substrate; and a cathode layer on a side of the light-emitting material layer away from the substrate, wherein the second structure is electrically connected to the first structure, the third structure is electrically connected to the second structure, the light-emitting material layer is provided with a first via hole therethrough, and the cathode layer is electrically connected to the third structure through the first via hole.

12. The display device according to claim 11, wherein the third structure is a two-layer layered structure comprising a first transparent conductive layer and a silver layer, wherein the silver layer is on a side of the first transparent conductive layer away from the substrate, and comprises:

a body part disposed on a surface of the first transparent conductive layer; and an extending part connected to the body part, disposed within the via hole, connected to the cathode layer.

13. The display device according to claim 1, wherein the OLED display panel further comprises a plurality of TFT devices, wherein the first structure, the second structure, and the third structure are provided in a one-to-one correspondence with one of the plurality of TFT devices.

14. The display device according to claim 13, wherein the light-emitting material layer contacts the cathode layer, and the silver layer contacts the cathode layer throughout the light-emitting material layer.

15. The display device of claim 1, wherein the third structure is connected in parallel with the cathode layer.

* * * * *